(12) United States Patent
Kothandaraman et al.

(10) Patent No.: US 7,227,804 B1
(45) Date of Patent: Jun. 5, 2007

(54) CURRENT SOURCE ARCHITECTURE FOR MEMORY DEVICE STANDBY CURRENT REDUCTION

(75) Inventors: Badrinarayanan Kothandaraman, Bangalore (IN); Eric Mann, Sammanish, WA (US); Thurman J. Rodgers, Woodside, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 206 days.

(21) Appl. No.: 10/827,785

(22) Filed: Apr. 19, 2004

(51) Int. Cl.
*G11C 5/14* (2006.01)
(52) U.S. Cl. .................. 365/229; 365/226; 365/227; 365/228; 365/189.06
(58) Field of Classification Search ............. 365/229, 365/228, 227, 226, 189.06
See application file for complete search history.

(56) References Cited

U.S. PATENT DOCUMENTS

| | | | | |
|---|---|---|---|---|
| 5,341,333 | A * | 8/1994 | Tien et al. | 365/189.06 |
| 5,369,613 | A * | 11/1994 | Matsui | 365/189.06 |
| 5,463,588 | A * | 10/1995 | Chonan | 365/226 |
| 5,694,364 | A * | 12/1997 | Morishita et al. | 365/201 |
| 5,862,096 | A * | 1/1999 | Yasuda et al. | 365/229 |
| 5,986,959 | A * | 11/1999 | Itou | 365/226 |
| 6,351,420 | B1 * | 2/2002 | Akaogi et al. | 365/189.09 |
| 6,452,414 | B1 * | 9/2002 | Lorenz | 324/765 |
| 2002/0080676 | A1 * | 6/2002 | Scott | 365/229 |
| 2004/0041623 | A1 * | 3/2004 | Andrews | 327/538 |

OTHER PUBLICATIONS

Nose et al., "V-th Hopping Scheme to Reduce Subthreshold Leakage for Low-Power Processors" *IEEE Journal of Solid-State Circuits*, vol. 37, No. 3, Mar. 2002, pp. 413-419.

Agarwal et al., "A Single-Vt Low-Leakage Gated-Ground Cache for Deep Submicron", *IEEE Journal of Solid-State Circuits*, vol. 38, No. 2, Feb. 2003, pp. 319-328.

Azeez et al., "The Impact of Intrinsic Device Fluctuations on CMOS SRAM Cell Stability", *IEEE Journal of Solid-State Circuits*, vol. 36, No. 4, Apr. 2001, pp. 658-665.

"CMOS Analog Integrated Circuits Based on Weak Inversion Operation" IEEE Journal of Solid-State Circuits, Jun. 1977.

"Intrinsic Leakage in Deep Submicron CMOS ICs—Measurement-Based Test Solutions" IEEE Transactions on Very Large Scale Integration (VLSI) Systems, Dec. 2000.

"Static-Noise Margin Analysis of MOS SRAM Cells" IEEE Journal of Solid-State Circuits, Oct. 1987.

* cited by examiner

*Primary Examiner*—Son Dinh
*Assistant Examiner*—Eric J. Wendler
(74) *Attorney, Agent, or Firm*—Haverstock & Owens LLP (57) ABSTRACT

A memory device (200) can include a memory cell block (202), a standby current source (206), an active current source (208), and a clamping device (212). In a standby mode, a standby current source (206) can provide constant standby current $I_{STBY}$ to memory cell block (202) via block supply node (204). In an active mode, active current source (208) can provide current to accommodate current necessary for active operations (e.g., accessing the memory cell block). A clamping circuit (212) can provide additional current in the event a block supply node (204) potential VCCX collapses due to the presence of micro-defects. In addition, compensation for process variation can be achieved by a self regulating well (454) to source (404) back bias that can modulate the threshold voltage of p-channel transistors of memory cells within the well (454), reducing overall leakage.

15 Claims, 4 Drawing Sheets

CURRENT SOURCE ARCHITECTURE FOR MEMORY DEVICE STANDBY CURRENT REDUCTION

TECHNICAL FIELD

The present invention relates generally to memory devices, and more particularly to methods and circuits for reducing a standby current in a memory device.

BACKGROUND OF THE INVENTION

Many memory devices have both an active and standby mode. In an active mode, storage locations can be accessed according to a particular operation (e.g., read, write, program, erase, etc.). In a standby state, storage locations are typically not accessed, and a memory device retains the data values stored within.

While it remains a continuing goal to reduce overall power consumption in memory devices, low power consumption can be a particularly important feature in limited power systems (e.g., battery powered devices). Such a need has given rise to low power memory devices, sometimes referred to as "micropower" or more battery life memory devices (including MoBL™ memory devices manufactured by Cypress Semiconductor Corporation of San Jose, Calif.).

The particular memory cells formed within a low power memory device can have various configurations, including one-transistor cell (e.g., dynamic random access memory (DRAM), or "pseudo" static RAMs (PSRAMs)). However, static RAM (SRAM) type memory cells can provide rapid performance, and in some configurations, can draw a favorably low stand-by current. More particularly, a six-transistor type SRAM type cell can draw relatively small amounts of current.

However, because of leakage current, a memory cell must typically draw some minimum current (referred to herein as a minimum data retention current) in order to retain a data value. Therefore, in a standby mode, a block of memory cells can have a minimum current draw necessary to retain stored data values.

Various approaches have been proposed for reducing power consumption in various types of semiconductor devices. A first conventional approach includes limiting a voltage provided to a block of memory cells (voltage control). As will be described below, while such an approach may be adequate for larger sized technologies and forgiving standby current values, such approaches may not be sufficient for smaller sized technologies and more stringent standby current specifications.

A second conventional approach includes threshold voltage (Vth) "hopping". In such an approach, when a circuit undergoes increased activity, a back-gate bias can be lower, decreasing the threshold voltages of transistors. Conversely, when the circuit is less active, a back-gate bias can be increased, providing higher threshold voltages for the transistors.

A drawback to such a conventional approach can be the additional circuits (e.g., charge pumps and the like) that may be necessary to generate the back-gate bias.

A third conventional approach includes a "gated-ground" for sections of a memory circuit. In particular, blocks of memory cells can be commonly connected to a "virtual" ground. The virtual ground, in turn, can be connected to the true ground by a "gating" n-channel transistor. When a block of memory cells is in a data-retention mode, the corresponding gating transistor is turned off.

A drawback to such a conventional approach can be data retention. Because a virtual ground is floating, eventually the necessary minimum data retention current for memory cells may no longer be present. This can result in loss/corruption of stored data values.

Other conventional approaches utilize more complicated manufacturing technologies, such as dual/multiple threshold devices. In such approaches selected transistors (e.g., those in certain current paths) are manufactured to have higher threshold voltages than others.

A drawback to such an approach can be the added complexity and/or cost necessary to provide such different threshold voltages.

Other conventional arrangements can include utilizing dual power supplies "dual-VDD" or dynamically boosting power supplies "VDD hopping". Both cases are aimed primarily at reducing the active current drawn by providing a high voltage to an active portion of the device, while providing a low voltage to inactive portions of the device. VDD hopping can have the same drawback as Vth hopping: the need for charge pump circuits, or the like.

While the above conventional approaches may provide adequate standby current values for certain manufacturing technologies, these approaches may not be suitable for more advanced technologies. In particular, as minimum transistor size capabilities increase, resulting leakage currents rise. Even more particularly, in metal-oxide-semiconductor (MOS) type integrated circuits, at gate sizes of 0.25 µm or even 0.16 µm voltage control techniques (e.g., maintaining a given voltage to a block of memory cells) may control leakage currents fairly well.

However, as manufacturing technologies migrate to smaller sized devices (e.g., 0.13 µm, 0.10 µm and below), such voltage control approaches can fail to meet more stringent lower power (e.g., low standby current) specifications. It is noted such higher standby current values typically arise from uncontrollable process variations, such as the dimensions of gate lengths (e.g., polysilicon pattern critical dimensions) and or threshold voltage mismatches within a memory cell.

In light of the above, it would be desirable to arrive at some way of reducing standby leakage current in a memory device without incurring the drawbacks of conventional approaches, like those noted above.

SUMMARY OF THE INVENTION

The present invention can include a memory device with a standby current source biased to provide a predetermined minimum current to a block of memory cells at a block supply node and thereby limit a maximum standby current supplied to the block of memory cells. In addition, an active current source can be coupled between a power supply and the block supply node. The active current source can be enabled when the block of memory cells is in an active mode, and disabled when the block of memory cells is in a standby mode.

In such an arrangement, in a standby mode, data values within a memory cell block can be maintained according to a minimum current value, as opposed to a forced voltage value. This can allow for a lower standby current while not adversely affecting data retention properties According to one aspect of the embodiments, a standby current source can comprise a p-channel metal-oxide-semiconductor field effect transistor (MOSFET) having a source-drain path coupled between the power supply and the block supply node.

Such an arrangement can be advantageously compact.

It is understood that the term "MOSFET" as used herein, should not be construed as limiting a transistor to any particular gate insulator type, and can include various other types of insulated gate field effect transistors and equivalents.

According to another aspect of the embodiments, a standby current source p-channel MOSFET can receive a reference bias voltage at its gate that is less than a high supply voltage and greater than a low power supply voltage.

In this way, such a p-channel MOSFET can be biased, as opposed to simply being driven to pure logic levels, as can be the case for voltage control solutions.

According to another aspect of the embodiments, a memory device can further include a beta multiplier current reference circuit. Further, a standby current source can be a current mirror with respect to the beta multiplier current reference.

In this way, a standby current can be a regulated current having a favorable response over various temperature ranges.

According to another aspect of the embodiments, an active current source can comprise a p-channel MOSFET having a source-drain path coupled between the power supply and the block supply node.

Such an arrangement can be an advantageously compact implementation.

According to another aspect of the embodiments, a memory device can include multiple standby current sources, each connected between a power supply node and a corresponding block supply node. Each standby current source can be biased to force a predetermined minimum current for the corresponding block supply node.

According to another aspect of the embodiments, the memory device can include multiple active decoded current sources, each connected between the power supply and a corresponding block supply node. Each decoded current source can be enabled when an associated decoder signal is active. In addition, a memory device can include a decoder circuit for activating one of the plurality of decoder signals in response to an applied address.

Such an arrangement can ensure that active memory cell blocks can be provided with sufficient current for normal (e.g., non-standby) operations.

According to another aspect of the embodiments, a memory device can also include a clamping device coupled between the power supply node and the block supply node. Such a clamping device can be enabled when a block supply node potential falls below a predetermined potential.

In this way, a clamping device can provide additional current in the event a memory cell block draws more current than expected. This can allow a memory device to remain functional even if a memory cell block includes current drawing defects, or suffers from threshold voltage drift over time.

According to another aspect of the embodiments, at least a portion of the memory cells are formed in an n-type well and include memory cell transistor drains coupled to the block supply node. In addition, the clamping device can comprise an n-channel depletion or native MOSFET having a source-drain path coupled between the power supply and the block supply node and a gate that receives a clamping voltage. In one arrangement, the clamping voltage can be the threshold voltage of a regular n-channel MOSFET.

Such an arrangement can be an advantageously compact implementation.

According to another aspect of the embodiments, the block of memory cells comprises a plurality of six transistor static random access memory (SRAM) cells.

Such cells can provide rapid response with favorable standby current characteristic.

According to another aspect of the embodiments, a block of memory cells comprises more than 32,000 SRAM cells and the predetermined minimum current is no more than 16 nA per block.

In this way, the embodiments may provide a lower standby current than conventional approaches, such as those utilizing voltage control.

The present invention may also include a method of manufacturing a memory device. Such a method can include characterizing a memory cell block to determine a minimum data retention current for the memory cell block. An additional margin current value can then be added to minimum data retention current to arrive at a maximum standby current. Further, a standby current supply transistor for the memory cell block can be sized to provide the maximum standby current to the memory cell block.

In this way, designing a memory device can be directed to current control instead of voltage control.

According to another aspect of the embodiments, sizing the standby current supply transistor includes sizing a channel width/length (W/L) ratio of the standby current supply transistor with respect to a channel W/L ratio of a reference transistor that provides a reference current.

In this way, a standby current can be based on a reference current.

According to another aspect of the embodiments, a method may further include determining a maximum defect standby current value, and sizing a clamping transistor to provide the maximum defect standby current value when a block power supply node for the memory cell block falls below a predetermined clamping level.

In this way, a clamping device can be included to accommodate unexpected increases in standby current, such as those arising from defects or transistor threshold drift, as but two examples.

According to another aspect of the embodiments, a maximum standby current is no more than 16 nA for 32,768 memory cells.

In this way, a maximum standby current can be reduced over conventional voltage control techniques.

The present invention may also include a semiconductor memory device that includes a plurality of memory cell blocks that each receives a block supply voltage at a corresponding block supply node. A standby current source can be coupled between a power supply voltage and each block supply node that provides a constant current to the corresponding memory cell block. An active current source can be provided between the power supply and each block supply node that provides an active current to the corresponding memory cell block when the corresponding memory cell block is in an active mode.

According to one aspect of the embodiments, each standby current source is one leg of a current mirror having another leg that draws a reference current. Each constant current can be no less than a minimum data retention current for the corresponding memory cell block.

According to another aspect of the embodiments, a semiconductor memory device can further include a clamping device coupled between the power supply voltage and each block supply node. Each clamping device can provide a clamping current to the corresponding memory cell block when the block supply node falls below a predetermined potential.

According to another aspect of the embodiments, each memory cell block comprises static random access memory cells with cross-coupled p-channel MOSFETs having sources coupled to the corresponding block supply node.

DETAILED DESCRIPTION

Various embodiments of the present invention will now be described in detail with reference to a number of drawings. The embodiments include current supply circuits for a block of memory cells in a memory device.

Figure 1:
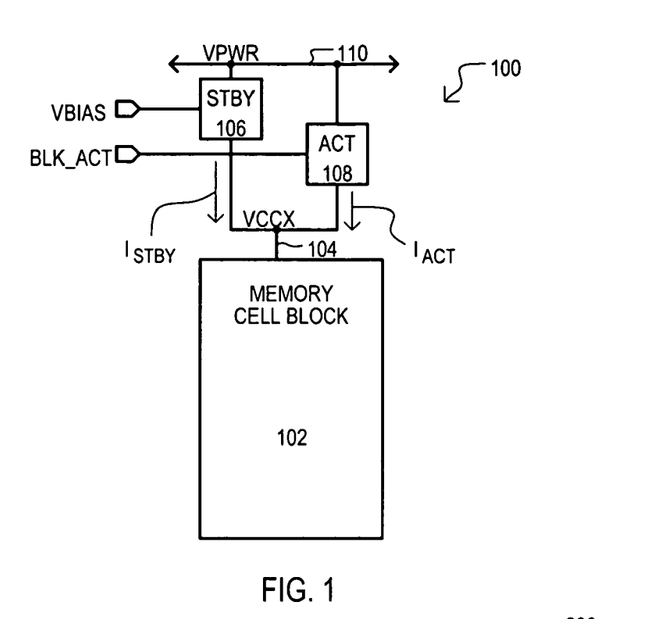
FIG. 1 is a block schematic diagram of a first embodiment of the present invention.

Referring now to FIG. 1, a memory device according to a first embodiment is set forth in a block schematic diagram and designated by the general reference character 100. A memory device 100 can include a memory cell block 102 with a number of memory cells. A memory cell block 102 can receive power at a block supply node 104.

A standby current source 106 and an active current source 108 can be situated between a power supply voltage node 110 and block supply node 104. An active current source 108 can provide an active current $I_{ACT}$ in an active mode of operation (e.g., when memory cells are accessed for a read/write operation).

Standby current source 106 can provide a constant or regulated standby current $I_{STBY}$. Such a standby current $I_{STBY}$ can be maintained at, or preferably above a minimum data retention current. It is understood that as a regulated current, $I_{STBY}$ can be supplied to memory cell block 102 without regard to a voltage VCCX at supply node 104. In this way, the embodiment differs from conventional voltage control approaches that control the voltage at supply node 104. In such conventional voltage control arrangements, a standby current that varies according to VCCX. As noted above, such conventional approaches may draw undesirably high amounts of current.

Looked at in another way, the embodiment of FIG. 1 can limit standby current in a memory device by establishing a maximum standby current, and then designing a standby current source to provide such a value.

In a standby mode of operation, active current source 108 can be disabled (i.e., by signal BLK_ACT), and thus an active current $I_{ACT}$ can be negligible in a standby mode. However, standby current source 106 can be enabled, supplying constant standby current $I_{STBY}$, and essentially ensuring that data values are retained within memory cell block 102.

In an active mode of operation, active current source 108 can be enabled, thus providing memory cell block 102 with additional current that may be needed for active mode operations.

While the above first embodiment 100 may advantageously provide a standby current that is both low in magnitude (as compared to voltage control techniques) yet sufficient to address data retention concerns, it may be desirable in increase the reliability of memory device to address defects and or drifting characteristics that may affect standby current. One such approach is shown in FIG. 2.

Figure 2:
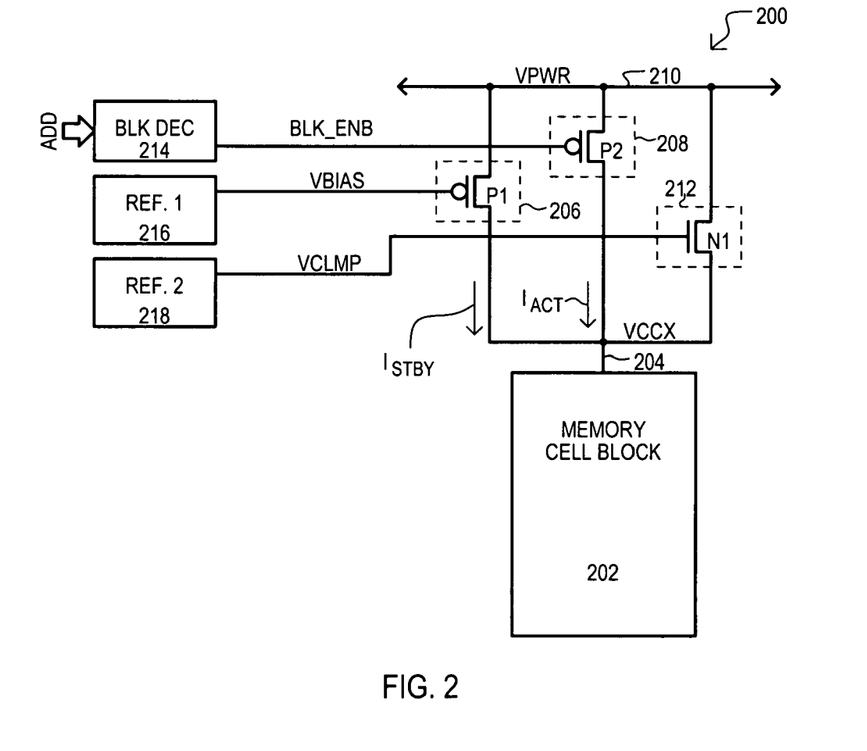
FIG. 2 is a block schematic diagram of a second embodiment of the present invention.

FIG. 2 includes some of the same general sections as FIG. 1. Thus, like sections will be referred to by the same reference character but with the first digit being a "2" instead of a "1".

Unlike the arrangement of FIG. 1, FIG. 2 also includes a clamping device 212 positioned between a power supply node 210 and block supply node 204. A clamping device 212 can provide a low impedance path between block supply node 204 and power supply node 210 in the event block supply node 204 potential falls outside a predetermined range.

A clamping device 212 can address increased current draw in a memory cell block 202 arising from unexpected conditions. If memory cell block 202 draws more current than a standby current, a voltage supplied (VCCX) to a memory cell block 202 may "collapse", resulting in loss/corruption of data values stored in the memory cells. However, by including a clamping device 212 extra current can be provided to memory cell block 202 to ensure a sufficient voltage (or sufficient current supply) for retaining data values in such an event. Such additional current draw could arise from a number of events, such as process defects and/or drift in the threshold voltage of transistors within the memory cells of memory cell block 202.

FIG. 2 also shows a block decoder 214, first reference circuit 216, and second reference circuit 218. A block decoder 214 can receive an address value (ADD), and if such an address value corresponds to memory cell block 202, can enable active current source 208. In the particular example of FIG. 2, a block decoder can drive a block enable signal (BLK_ENB) low when an address value (ADD) corresponds to a memory cell block 202.

A first reference circuit 216 can provide a bias voltage (VBIAS) to a standby current source 206. In response to such a bias voltage (VBIAS), standby current source 206 can provide constant standby current $I_{STBY}$. A second reference circuit 218, which may or may not be coupled to the first reference voltage, can provide a clamping voltage VCLMP to clamping circuit 210. A clamping voltage VCLMP can establish the relative potential difference between a power supply voltage VPWR and block supply voltage VCCX that will result in clamping circuit 210 being enabled.

In the very particular example of FIG. 2, a standby current source 206 can be a p-channel (MOSFET) P1 having a source-drain path coupled between a power supply node 210 and block supply node 204, and a gate that receives a bias voltage VBIAS. Such a "one-transistor" arrangement can be advantageously compact.

It is understood that the term "MOSFET" as used herein, should not be construed as limiting a transistor to any particular gate insulator type, and can include various other types of insulated gate field effect transistors and equivalents.

Similarly, an active current source 208 can be a p-channel MOSFET P2 having a source-drain path coupled between a power supply node 210 and block supply node 204, and a gate that receives a block enable signal (BLK_ENB). Again, this one-transistor arrangement can be advantageously compact.

A clamping device 212 can be an n-channel depletion or native MOSFET N1 having a source-drain path connected between power supply node 210 and block supply node 204, and a gate that received clamping voltage VCMLP. In one particular arrangement, a clamping voltage VCLMP can be a threshold voltage Vtn for a regular n-channel MOSFET (e.g., enhancement mode n-channel MOSFET).

In this way, a memory device can include a standby current source for supplying regulated standby current, an active current source that can be selectively activated according to an applied address, and a clamping device that can provide extra current in the event a defect or other condition that increases a minimum data retention current beyond that of the standby current.

Figure 3:
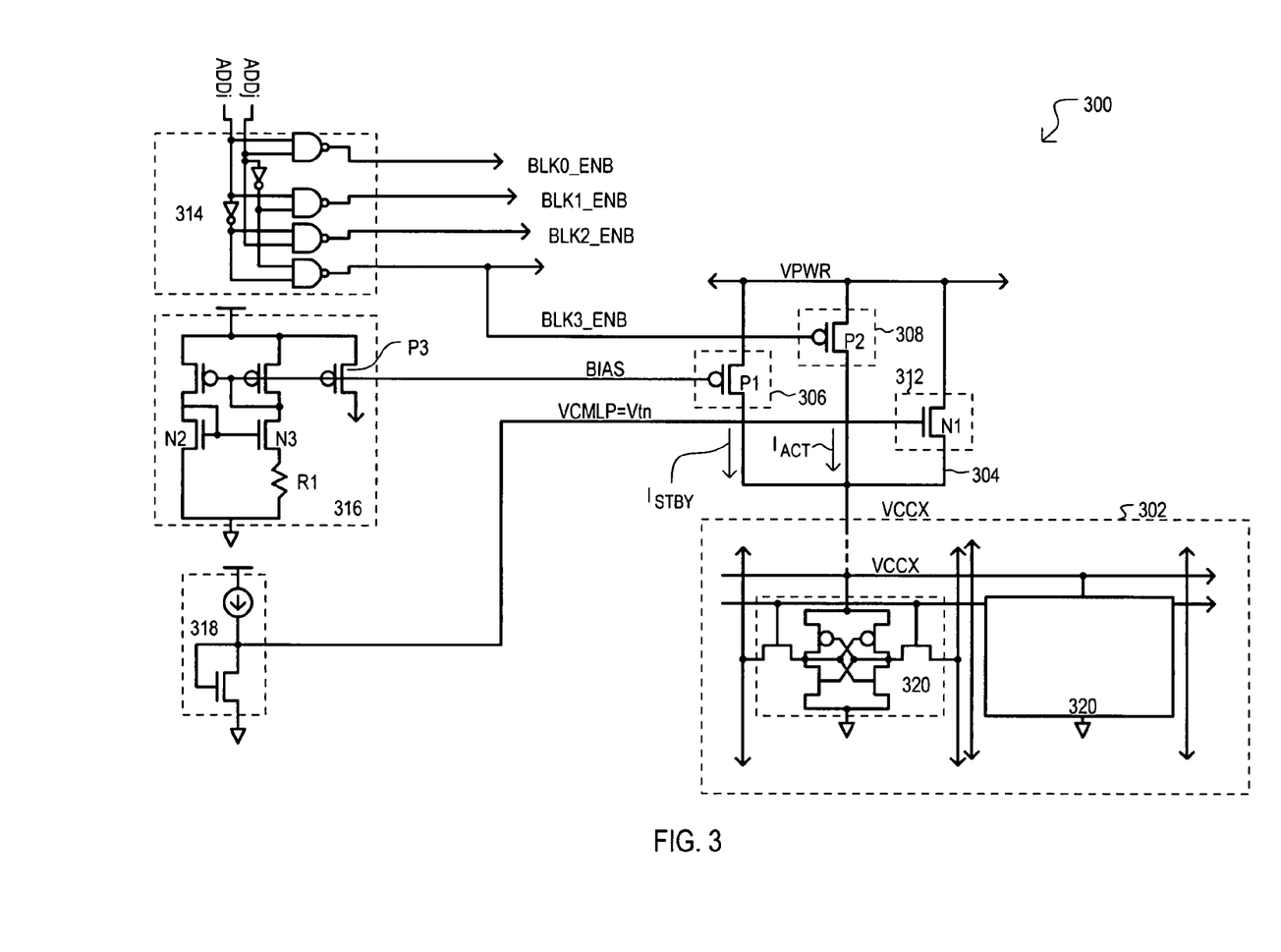
FIG. 3 is a detailed schematic diagram of a third embodiment of the present invention.

Referring now to FIG. 3, a memory device 300 according to a third embodiment is set forth in a detailed schematic diagram. FIG. 3 includes some of the same general sections as FIG. 2. Thus, like sections will be referred to by the same reference character but with the first digit being a "3" instead of a "2".

In the example of FIG. 3, a memory cell block 302 may include six-transistor (6-T) type static random access memory (SRAM) cells 320 having p-channel device coupled to a block supply node 304. It is understood that the present invention should not necessarily be limited to any particular type of memory cell.

FIG. 3 also shows a particular type of a first reference circuit 316 and second reference circuit 318. A first reference circuit 316 can be a beta multiplier circuit that generates a reference current Iref that follows the relationship:

$$Iref = (nkT/Q)\ln\{m\}/R$$

where kT/Q is the thermal voltage, m is the ratio between n-channel devices (N2 and N3) forming the current mirror within the reference circuit 316, n is a sub-threshold slope factor, and R is a value of resistor R1 within reference circuit 316.

From the above, it can be understood that reference current Iref can be proportional to absolute temperature. Standby current $I_{STBY}$ can be generated by mirroring reference current Iref, thus a standby current $I_{STBY}$ can also be proportional to absolute temperature. In this way, a standby current $I_{STBY}$ can be reliably maintained at an essentially constant magnitude.

Of course, while a beta multiplier reference circuit current 316 may provide a reference circuit that can be advantageously compact and not require more complex structures, such as bipolar transistors, or the like, the present invention should not necessarily be limited to such an arrangement. As but one of the many possible alternate arrangements, a band-gap type reference circuit could be included as a reference circuit.

In one very particular example, a size ratio m can be 4, a sub-threshold factor n can be in the general range of 1.2, and resistor R1 can be a resistor formed from polysilicon having a value of about 1.15 Megohms. Further, a standby current source P1 can have a W/L ratio that is ¼ that of reference current supply transistor P3. Thus, a standby current $I_{STBY}$ can be about ¼ of Iref.

It is emphasized that the above values are but examples of one way to arrive at a particular reference voltage value. Such values may be changed as desired or needed for the particular application. For example, a relative W/L ratio between transistors P3 and P1 can be selected to achieve a desired $I_{STBY}$ value. In addition or alternatively, other components values can be changed (e.g., resistance R) or different circuits used to generate a desired reference current value $I_{REF}$.

In addition, in one particular example, an n-channel transistor N1 can be sized to provide a maximum current (e.g., Idsat) of about 200 nA.

Figure 4:
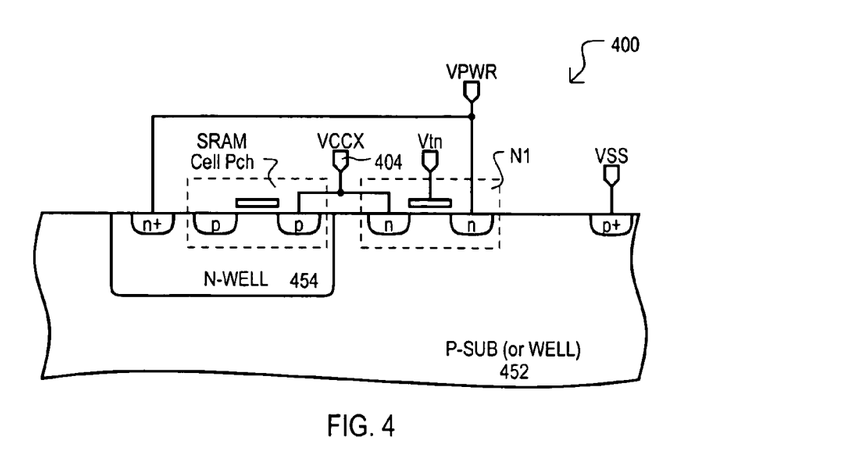
FIG. 4 is a side cross sectional view illustrating a clamping circuit according to one embodiment of the present invention.

One example of a clamping circuit, such as that shown as N1 in FIG. 3, is shown in a side cross sectional view in FIG. 4. FIG. 4 shows a portion of a memory device 400, including a p-type substrate 452 biased to a low power supply voltage VSS in which can be formed clamping transistor N1. Clamping transistor N1 has a drain connected to a supply voltage VPWR and a source connected to a block supply node 404. A gate of clamping transistor N1 can receive a clamping voltage, which in this particular example is a threshold voltage of the clamping transistor N1.

Formed within p-type substrate 452 can be an n-type well 454. In the particular example of FIG. 4, n-type well 454 can include p-type transistors for memory cells (SRAM Cell Pch) within a memory cell block. Sources of such SRAM p-channel devices can be connected to a block supply node VCCX. N-well 454 can be biased to a supply voltage VPWR.

This biasing arrangement can give rise to an automatic back bias potential for n-type well 454, the magnitude of which can increase with leakage characteristics of the memory cells. For example, in the event the leakage of memory cells becomes higher, a value of a block supply voltage VCCX can drop. As a result a difference in potential between VCCX and VPWR can increase. However, such an increase in potential results in a higher threshold voltage for those p-channel transistors formed within the n-type well 454. Such a higher threshold voltage decreases leakage current for such transistors.

In this way, a clamping device/circuit (e.g., items 212, 312, and/or N1) can advantageously generate a self-regulating back bias for controlling leakage current for a memory cell block. Further, such an arrangement can be accomplished without the need for bias voltage generating circuits that may require charge pump circuits, or the like.

In the above arrangement, in the event micro leakage occurs within a memory cell block, the amount of current drawn by the memory cell block may exceed that provided by a standby current source. Consequently, a block supply node may begin to drop in potential. However, because N1 is an n-channel depletion or native source follower it can source current to clamp block supply node 404 to a particular voltage Vtn.

Having described three particular embodiments, modes of operation for the second and third embodiments will now be described with reference to FIGS. 5A to 5C.

Figure 5A:
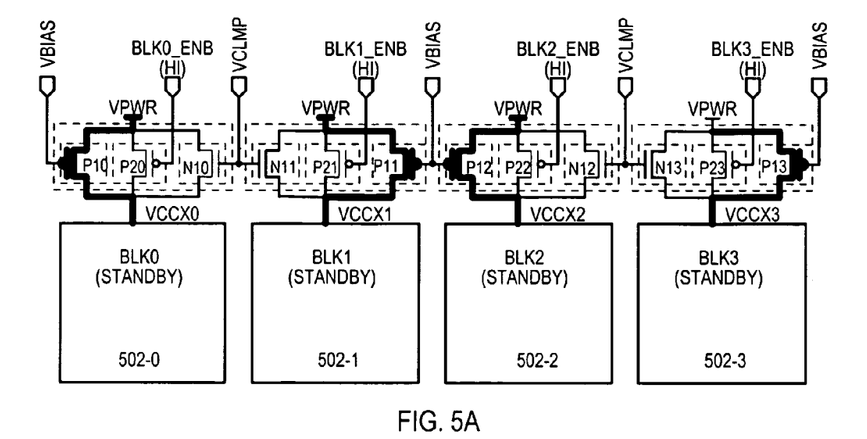
FIGS. 5A to 5C are block diagrams showing various operating conditions according to embodiments of the present invention.
Figure 5B:
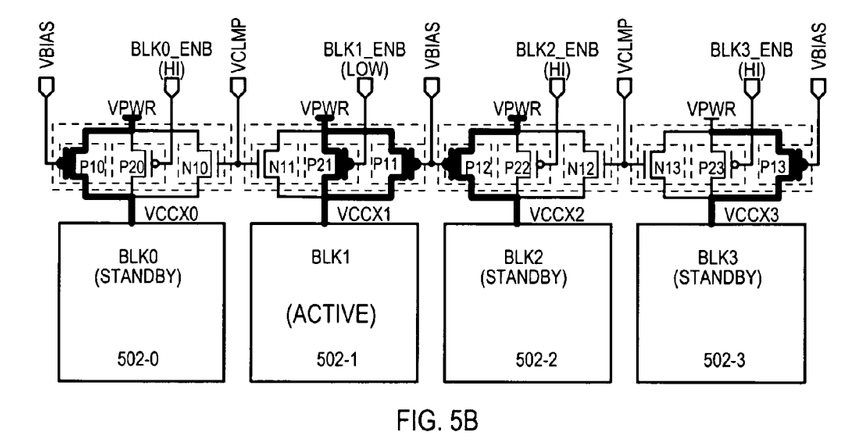
Figure 5C:
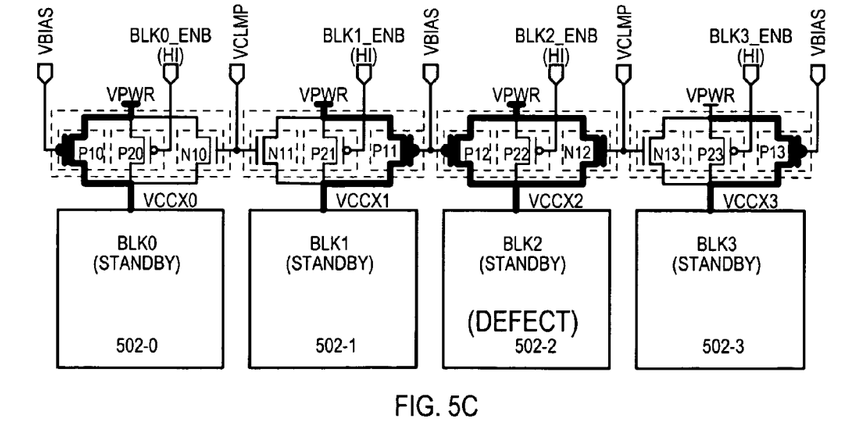

FIGS. 5A to 5C are block schematic diagrams of a memory device that includes four memory cell blocks (502-0 to 502-3). Memory cell blocks (502-0 to 502-3) can include a corresponding standby current sources (P10, P11, P12 and P13, respectively), active current source (P20, P21, P22 and P23, respectively), and clamping devices (N10, N11, N12 and N13, respectively).

FIG. 5A shows a "normal" standby mode of operation, in which memory cell blocks (502-0 to 502-3) are functioning normally, and hence require some minimum data retention current. In such a mode of operation, all standby current sources (P10, P11, P12 and P13) can be enabled, and thus can supply a standby current $I_{STBY}$ to each memory cell block. In one particular approach, $I_{STBY}$ can be designed to meet a minimum data retention current and include some additional margin. Of course, if one memory cell block differs from another (e.g., is larger or varies on some other fashion), such a block may require a higher a standby current $I_{STBY}$. In such a case, the resulting standby current source would be designed to meet (and preferably exceed by some margin) such a higher or lower current.

FIG. 5B shows an "active" mode of operation, in which memory cell block 502-1 is accessed, while the remaining memory cell blocks (502-0, 502-1 and 502-3) can be in a standby state. As a result, active current source P21 can be enabled to supply additional current (and raise VCCX1) to allow for rapid access to memory cells within memory cell block 502-1.

Of course, according to the particular size of active current source P21, a resulting source-drain voltage of standby current source P11 may result in such a current source providing less than the minimum standby current $I_{STBY}$, or turning off altogether.

FIG. 5C shows a "clamped standby" mode of operation, in which memory cell block 502-2, although in a standby mode, draws some additional current due to some condition (e.g., short-type defect, drift in threshold voltages of cell devices, etc.). Such an additional current draw can result in block supply voltage VCCX2 falling to a level lower than a supply voltage VPWR by an amount greater than the Vtn of clamping device N12. As a result, transistor N12 can be enabled and provides additional current to prevent a block power supply for memory cell block 502-2 from "collapsing".

In this way, a current supply arrangement can be implemented on a block basis. Such an arrangement may be particularly advantageous to assist in defect isolation. Further, providing a clamping circuit on a block basis can result in devices that remain fully operation, while not necessarily meeting the most stringent low current specification. Such devices can remain suitable for other applications with less stringent current requirements.

One very particular example of advantageous results that can result from minimum standby current techniques like those illustrated above, is set forth in Table 1, below. Table 1 shows a comparison between general results achieved by a conventional voltage control technique (Force VCCX=1.95 volts), versus that achieved by techniques of the present embodiments (Force $I_{STBY}$). As shown, when a voltage control technique is employed, a leakage current can be in the general range of 10 μA. However, if a standby current is limited, a resulting leakage current can be in the general range of 3.2 μA to 4 μA. In this way, considerable reductions in standby current can be achieved over conventional voltage control techniques.

| DEVICE SIZE | METHOD | I LEAK |
|---|---|---|
| 8 M SRAM | Force VCCX = 1.95 V | 12 μA |
| 8 M SRAM | Force $I_{STBY}$ | 3.2 μA to 4 μA |

Of course the above results reflect only one example of possible results. Data for Table 1 corresponds to an 8 megabit 8 (M) SRAM device having memory cells arranged into 264 blocks. In the conventional method "Force VCCX=1.95 V", each block has a supply node forced to the value of 1.95 volts. Thus, a block voltage is forced without regard to current flow into the block. In contrast, in the method according to the embodiments, a standby current source for each such block can force a block supply current of 12 to 15 nA. Thus, a block current is forced without regard to a block supply voltage. It is noted that the 264 blocks can still retain data for a minimum data retention current of 2 μA (e.g., average of about ~7.2 nA per block). However, additional current is provided by the standby current sources in order to provide adequate margin over such a minimal value.

Figure 6:
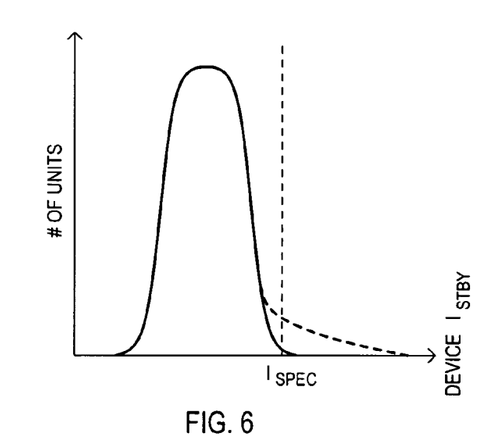
FIG. 6 is a graph representing a conventional standby current distribution and one that can arise from embodiments of the present invention.

FIG. 6 is a graph representing two distributions of standby current values. One distribution, shown as a solid line, can represent a distribution that can result from the "current forcing" techniques of the above described embodiments. The other distribution, shown as a dashed line, can represent a distribution that can result from conventional voltage control techniques. FIG. 6 also shows a lower power specification limit Ispec.

As represented by the dashed distribution, a conventional approach can include an undesirable "tail" of devices falling outside the specification Ispec. By utilizing current forcing techniques, standby currents can be reduced, resulting in the limitation of such a "tail".

The present invention may also include a design method for a low power memory device. Such a method is set forth in FIG. 7, and designated by the general reference character 700.

Figure 7:
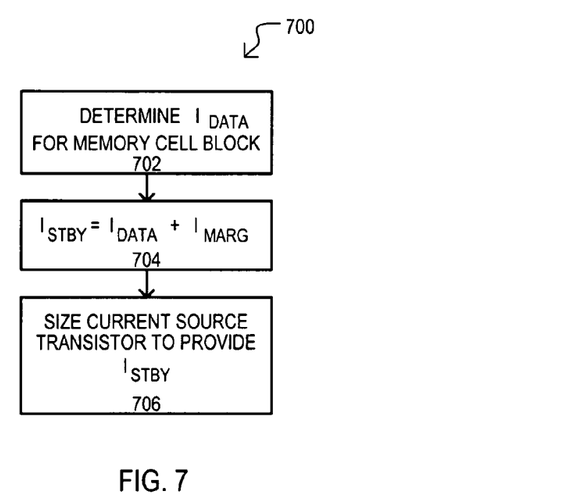
FIG. 7 is a flow diagram showing a method of designing a memory device according to one embodiment.

A method 700 can include determining a cell block minimum data retention current $I_{DATA}$ (step 702). Such a value can be about the smallest current amount that can be provided to a memory cell block, yet still retain data values. As but one example, such a value can be a current value that results in a predetermined yield for a given device wafer, lot, manufacturing run, etc.

Method 700 may also include determining a standby current $I_{STBY}$ by adding an additional margin current $I_{MARG}$ to the minimum data retention current $I_{DATA}$ (step 704). An additional margin current can be determined in a number of ways. As but two of the many possible ways, a margin current may be determined according to a maximum standby current specification, or can be generated to accommodate expected drift in memory cell transistors over time.

Method 700 can further include sizing a current source device to provide the standby current $I_{STBY}$ (step 706). For example, in the embodiment of FIG. 3, a channel width/length (W/L) ratio for standby current source transistor P1 can be sized with respect to the W/L ratio of the reference current transistor (P3) (i.e., the current leg being mirrored).

While the various embodiments of the present invention can enjoy wide application in various industries, the embodiments may be particularly applicable to low power RAM devices, such as low power SRAMs.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   at least one standby current source biased to provide a predetermined minimum current to a block of memory cells at a block supply node and thereby limit a maximum standby current supplied to the block of memory cells;

at least one active current source coupled between a power supply node and the block supply node that is enabled when the block of memory cells is in an active mode, and disabled when the block of memory cells is in the standby mode; and at least one clamping device coupled between the power supply node and the block supply node that is enabled when a potential of the block supply node falls below a predetermined potential.

2. The memory device of claim 1, wherein:
the standby current source comprises a p-channel insulated gate field effect transistor (IGFET) having a source-drain path coupled between the power supply and the block supply node.

3. The memory device of claim 2, wherein:
the standby current source p-channel IGFET receives a reference bias voltage at its gate that is less than a high supply voltage and greater than a low power supply voltage.

4. The memory device of claim 3, further including:
a beta multiplier current reference circuit that includes a reference current supply transistor that provides a reference current; and
the standby current source is a current mirror with respect to the reference current supply transistor.

5. The memory device of claim 1, wherein:
the active current source comprises a p-channel IGFET having a source-drain path coupled between the power supply and the block supply node.

6. The memory device of claim 1, wherein:
the at least one standby current source includes a plurality of standby current sources each connected between the power supply node and a corresponding block supply node, each standby current source biased to provide a constant standby current to the corresponding block supply node.

7. The memory device of claim 1, wherein:
the at least one active current source includes a plurality of decoded current sources each connected between the power supply and a corresponding block supply node, each decoded current source being enabled when an associated decoder signal is active; and
a decoder circuit for activating one of the plurality of decoder signals in response to at least a portion of an applied address.

8. The memory device method of claim 1, wherein:
at least a portion of the memory cells are formed in an n-type well and include memory cell transistor drains coupled to the block supply node; and
the at least one clamping device comprises a non-enhancement mode n-channel IGFET having a source-drain path coupled between the power supply and the block supply node and a gate that receives a clamping voltage.

9. The memory device of claim 8 wherein:
the clamping voltage is the threshold voltage of the n-channel IGFET.

10. The memory device of claim 1, wherein:
the block of memory cells comprises a plurality of six transistor static random access memory (SRAM) cells.

11. The memory device of claim 1, wherein:
the block of memory cells comprises more than 32,000 SRAM cells and the predetermined minimum current is no more than 16 nA.

12. A semiconductor memory device, comprising:
a plurality of memory cell blocks that each receive a block supply voltage at a corresponding block supply node;
a standby current source coupled between a power supply voltage and each block supply node that provides a constant current to the corresponding memory cell block;
an active current source between the power supply and each block supply node that provides an active current to the corresponding memory cell block when the corresponding memory cell block is in an active mode;
at least one well formed within a substrate that includes a plurality or memory cell transistors; and
a clamping device that provides a feedback loop for increasing a body bias for the memory cells of the at least one well as the supply node potential decreases.

13. The semiconductor memory device of claim 12, wherein:
each standby current source is one leg of a current mirror having another leg that draws a reference current; and
each constant current is no less than an expected minimum data retention current for the corresponding memory cell block.

14. The semiconductor memory device of claim 12, further including:
the clamping device is coupled between the power supply voltage and each block supply node that provides a clamping current to the corresponding memory cell block when the block supply node falls below a predetermined potential.

15. The semiconductor memory device of claim 14, wherein:
each memory cell block comprises static random access memory cells with cross-coupled p-channel insulated gate field effect transistors having sources coupled to the corresponding block supply node and n-wells coupled to the power supply voltage.

* * * * *